United States Patent

[15] 3,691,694

[45] Sept. 19, 1972

Goetz et al.

[54] WAFER POLISHING MACHINE

[72] Inventors: Frederick E. Goetz, Wappingers Falls; James R. Hause, La Grangeville, both of N.Y.

[73] Assignee: International Business Machines Corporation, Armonk, N.Y.

[22] Filed: Nov. 2, 1970

[21] Appl. No.: 85,999

[52] U.S. Cl. ....................51/80, 51/118

[51] Int. Cl. ........B24b 7/00, B24b 9/00, B24b 29/00

[58] Field of Search ....................51/80 R, 118

[56] References Cited

UNITED STATES PATENTS

| | | | |
|---|---|---|---|
| 2,045,488 | 6/1936 | Oubridge | 51/118 |
| 1,995,676 | 3/1935 | Gagnon | 51/118 |
| 2,709,876 | 6/1955 | Indge | 51/118 |
| 2,973,605 | 3/1961 | Carman | 51/118 |
| 3,089,292 | 5/1963 | Hunt | 51/118 |

*Primary Examiner*—Othell M. Simpson
*Attorney*—Hanifin & Jancin and William J. Dick

[57] ABSTRACT

This patent relates to apparatus for removing and polishing opposite surfaces of a semiconductor wafer. The apparatus comprises a rotatable platen having an abrasive upper surface upon which a mask having suitable apertures therein for receiving wafers is positioned. A hoop is connected to the mask for imparting rotation thereof separately from the rotation of the platen. Overlying the mask and wafers is a second lapping means having an abrasive surface thereon for applying a uniform pressure upon the opposite surface of the wafer. Separate drive means cooperate with the second lapping means for separately driving the lapping means os that upon rotation of the platen, hoop and mask, and second lapping means the opposite planar surfaces of the wafer is brought into coplanarity while being polished. During the operation of the apparatus the surface of the wafers is continuously wetted with an excess quantity of a displacement plating solution containing, for example, a cupric or silver nitrate and a fluoride anion, the solution being maintained preferably at a pH of less than 7.

14 Claims, 6 Drawing Figures

INVENTORS
FREDERICK E. GOETZ
JAMES R. HAUSE

BY William J Dick
ATTORNEY

WAFER POLISHING MACHINE

SUMMARY OF THE INVENTION AND STATE OF THE PRIOR ART

The present invention relates to apparatus for removing a portion of the surface from opposite sides of a workpiece and more particularly relates to apparatus for polishing both planar sides of a silicon wafer.

Conventional polishing techniques with silicon wafers is to polish the surface of the wafer in which devices are to be diffused. As device geometry has been reduced in size, alignment of the photo masks to the photo sensitized surface of the wafer has become increasingly difficult. Conventional wafer chucks, in the alignment apparatus, employ a vacuum to hold the wafer, but if the wafer contains a rough surface which is exposed to the vacuum, displacement of the wafer relative to the chuck sometimes occurs causing misalignment between the wafer and the mask and if not corrected results in the entire wafer being rejected if the exposure of the photo sensitized surface is inadvertently misaligned. Additionally, as device geometry decreases, it has become evident that it may be necessary to utilize the opposite planar surface of the wafer to obtain additional working area.

In view of the above it is a principal object of the present invention to provide apparatus which will simultaneously polish both surfaces of a wafer to substantially reduce irregular surface conditions on opposite planar sides of the wafer.

Another object of the present invention is to provide apparatus which will polish or remove portions of the silicon surfaces on opposite sides of the wafer to achieve coplanarity between opposite sides of the wafer.

Still another object of the present invention is to provide novel apparatus which may be utilized in conjunction with a displacement plating solution such as disclosed in U.S. Pat. No. 3,436,259 to Regh et al. on Apr. 1, 1969 and assigned to International Business Machines Corporation, the assignee of this application.

Still another object of the present invention is to provide apparatus capable of free polishing the wafer to avoid the step of mounting the wafer to a premounted surface substrate by the use of an adhesive.

Another object of the present invention is to provide apparatus which permits of varying the rate of removal of material selectively from one or both sides of the wafer.

Other objects and a fuller understanding of the present invention may be had by referring to the following specification and claims taken in conjunction with the accompanying drawings in which:

Figure 1:
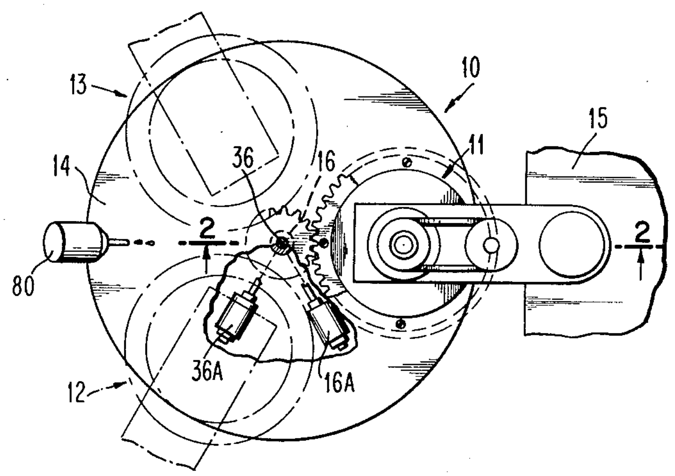
FIG. 1 is a fragmentary schematic plan view of a wafer polishing machine constructed in accordance with the invention.
Figure 4:
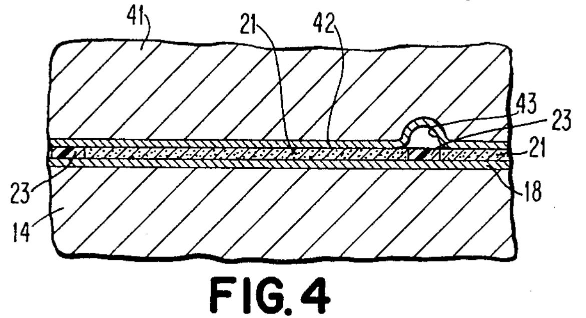
FIG. 4 is an enlarged fragmentary sectional view taken along line 4—4 of FIG. 3.

Referring now to the drawings, and especially FIG. 1 thereof, a wafer polishing machine 10 comprising in the present instance three identical polishing heads 11, 12 and 13 respectively, spaced equal distance about a first polishing means including a table or platen 14, is illustrated therein. Each of the heads is supported on a frame 15 of the machine and inasmuch as heads 12 and 13 are identical to heads 11, only this head will be considered in the following description.

In accordance with the invention the polishing machine 10 effects polishing or removal of material from a workpiece, in the present instance a silicon wafer, at a selective rate and simultaneously from both sides of the wafer. To this end and referring first to FIG. 2, the platen or table 14 is mounted on a shaft 16 and connected to drive means 16A (FIG. 1) for effecting rotation of the platen about a central axis 17. On the upper surface of the platen 14 is a polishing cloth or abrasive surface 18, the surface being composed of, for example, a pellon paper, a napped cloth such a Micro cloth, or Corfam (a trademark of E. I. DuPont de Nemours and Company).

Superimposed of the polishing cloth 18 is the head 11, the head being supported by a strut 19 which projects radially from a vertical reciprocable post 20 mounted on the frame 15 of the machine.

In order to effect a uniform polishing of the lower surface of wafers 21 which are brought against the polishing surface 18 of the platen 14, and to compensate for different distances travelled by the platen 14 about the central axis 17 (i.e., different circumferential distances traveled adjacent the axis versus the periphery of the platen) the wafers are rotated about the central axis 22 of the head 11 while being retained from inadvertent displacement. To this end and in accordance with one feature of the invention, a workpiece holding means or holder, in the present instance a mask 23, including means defining a plurality of apertures 24 for receiving wafers 21 therein, is connected as by screws 25 through extended points 26 of a scalloped edge 27 to a hoop 28. As illustrated the hoop 28 comprises a ring including a planar or flat surface 29 which merges into an outwardly and upwardly sloped peripheral portion 30. It is preferable that the holder or mask 23 have a thickness less than the desired thickness of the wafers or workpieces 21 so as to reduce frictional wear of the mask upon the platen 14 being rotated. Mylar (a trademark of E.I. DuPont de Nemours and Company) is a suitable material for use as a mask.

Figures 2, 5:
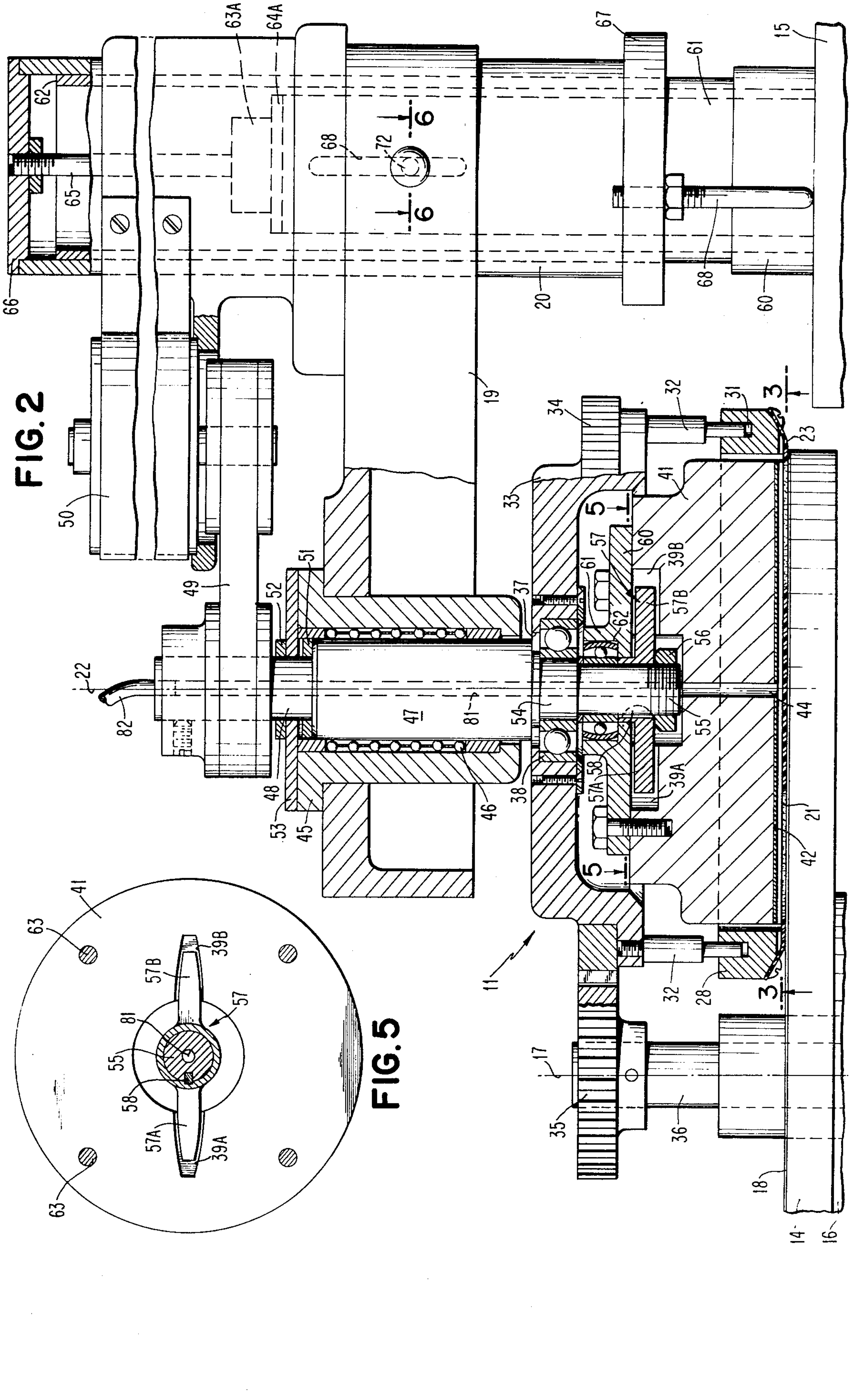
FIG. 2 is an enlarged fragmentary sectional view taken along line 2—2 of FIG. 1.
FIG. 5 is a sectional view taken along line 5—5 of FIG. 2.

In order to effect rotation of the hoop 28 and thus the holder or mask 23 at a preselected speed, separate drive means are employed. To this end and as best shown in FIG. 2, the hoop 28 contains a plurality of bored holes 31 which extend about the hoop and are adapted to loosely receive pins 32 which are free to move axially in the bored holes 31. At their opposite ends the pins 32 are connected to a bell-shaped plate 33 having mounted thereon a gear ring 34, the gear ring meshing with the teeth of a drive gear 35 which is pinned to a drive shaft 36 concentrically and rotatably mounted with respect to the shaft 16 and adapted to be rotated separately from the platen 14 by, for example, variable speed drive means 36A shown schematically in FIG. 1.

Figure 3:
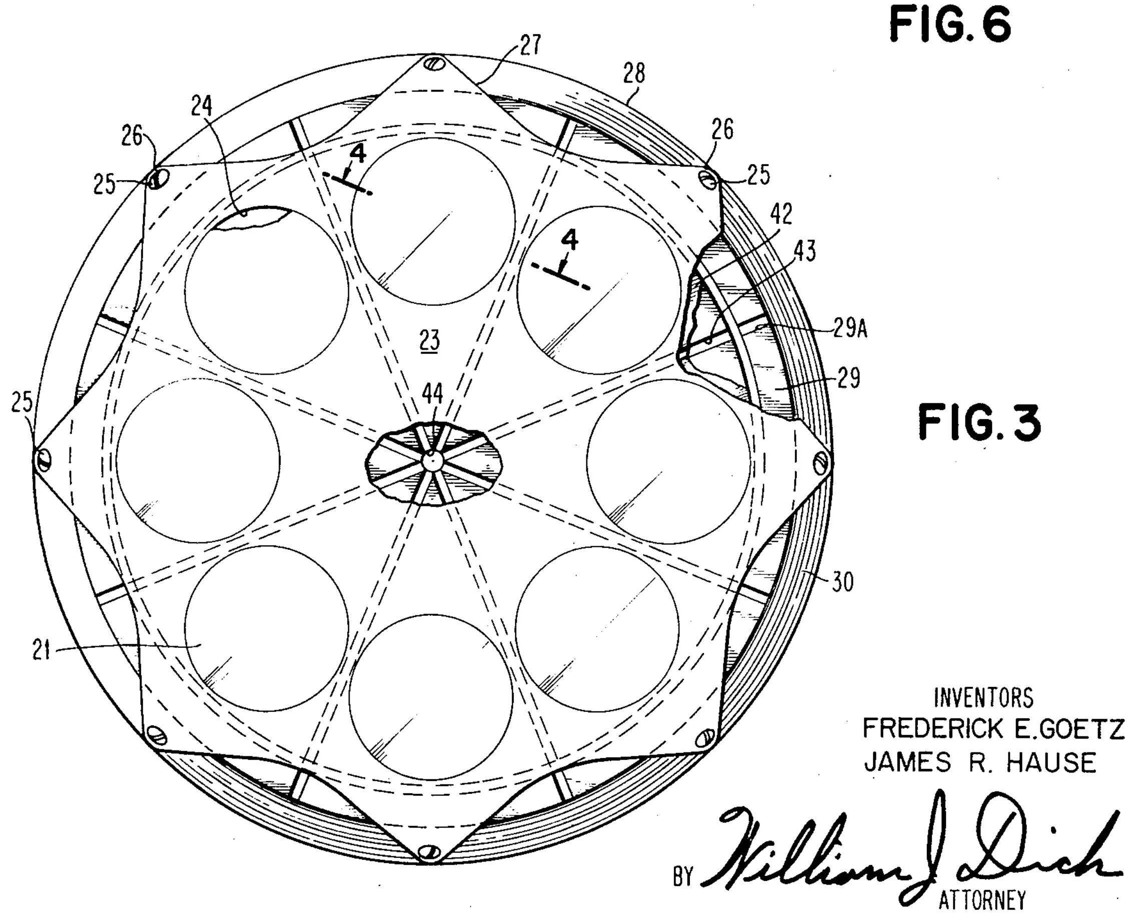
FIG. 3 is a fragmentary sectional view taken along line 3—3 of FIG. 2.

Second lapping means are positioned superimposed of the mask 23 and wafers 21 to engage and lap the back surface of the wafers while pressing the wafers against the abrasive surface 18 on the platen 14. To this end the second lapping means comprises a pressure plate 41 having an abrasive surface, in the present instance a lapping cloth 42 attached to the lower surface of the plate 41 and extending into radially extending slots or grooves 43 which eminate from a central conduit 44 extending axially through the plate 41. The plate has a sufficient weight and is connected in such a manner as to apply a predetermined pressure upon the wafers 21 intermediate the polishing cloth or abrasive surfaces 18 and 42. For example, it has been found that a pressure of approximately 2 pounds per square inch is useful for attaining a fine smooth surface on the wafers 21. For purposes which will become more evident hereinafter the flat 29 associated with the hoop 28 contains grooves 29A spaced about the periphery of the hoop, in the illustrated instance and as best shown in FIG. 3 the number of slots 29A being coincidental to the number of grooves 43 in the lower surface of the plate 41.

The plate 41 is adapted for independent rotation upon the wafers in the mask while being capable of independent levelling about its central axis. To this end, and referring first to FIG. 2 the strut 19 supports a bushing 45 in which is mounted a linear rotary bearing 46 to permit rotation of an enlarged portion 47 of a shaft 48 therein. The shaft 48 is adapted for rotation as by a drive belt 49 and separate drive means 50, in the present instance a variable speed electric motor. A pair of thrust collars 51 and 52 are axially spaced apart to support the shaft 48 by engagement with an apertured cover plate 53 mounted on the bushing 45. The lower portion 54 of the shaft 48 extends through an aperture 37 in the bell-shaped plate or housing 33 wherein is mounted a bearing 38 to permit relatively friction-free rotation of the shaft 48 while permitting independent rotation of the cover plate 33. The lower end 55 of the shaft 48 is threaded so that a nut 56 may engage and support a pair of radially extending splines 57 which are keyed to the shaft as by a Woodruff key 58. The splines 57A and 57B (see FIGS. 2 and 5) engage recessed slots 39A and 39B in the plate 41 which have a depth greater than the thickness of the spline to permit axial movement of the shaft 48 while permitting rotation of the plate 41 upon rotation of the shaft 48. A cap 60 having a hub 61 and an annular recessed portion 62 is connected as by bolts or the like 63 to the plate 41 so that elevation of the head 11, in a manner which will be more fully explained hereinafter, effects simultaneous elevation of the plate 41.

To permit self-alignment of the plate 41 and the abrasive surface thereof relative to the wafers 21, a self-aligning bearing 64 is positioned in the recess 62 of the boss 61 with sufficient clearance between the splines 57 to permit skewing of the plate 41 relative to the axis 22 of the shaft 48.

In order to load wafers 21 into the apertures 24 in the mask 33, the head 11 is elevated, and inasmuch as the pins 32 are vertically slidable in the bored holes 31 in the hoop 28, the entire head including the gear ring 34 and plate 41 will be removed from the interior of the hoop. If desired, the strut 19 may then be rotated for access to the apertures for loading of wafers into the mask. In order to elevate the head 11, the post 20 comprises a pneumatic lift which includes a collar 60 connected to the frame 15. Concentrically mounted in the collar and extending upwardly therefrom is a column 61 having an open upper end 62. As illustrated, the post 20 is concentrically mounted and telescopically engaged upon the column 61. Coaxially mounted within the column 61 and secured to the frame 15 is a pneumatic cylinder 63A including a piston 64A having a piston rod 65, the upper end of which is threadedly engaged in a cap 66 which seals the end of the post 20. It should be noted that upon rotation of the post, inasmuch as the piston rod 65 is connected through the cap 66 to the post 20, both the post, rod, and piston will rotate together about their common longitudinal axis.

To latch the strut 19 in position about the circumference of the post, with the head in the position illustrated in FIG. 2, a longitudinally extending keyway 68 is provided in the column 61. Formed in the post 20 and strut 19 is an opening or passageway 69, the outer portion of the opening including a threaded bushing 70 which is secured to the strut 19 and through which passes a spring loaded latch 71 which carries a disc-shaped key 72 at its outer end for registry with the outwardly extending keyway 68 in the column 61.

In order to set the lower limit of travel of the post relative to the columns the post includes a flange 67 through which is threaded an adjustable stop 68 for engagement with any convenient portion of the frame 15. In this manner the head position and thus the second lapping plate's position relative to the wafers may be easily and repeatedly attained.

Figure 6:
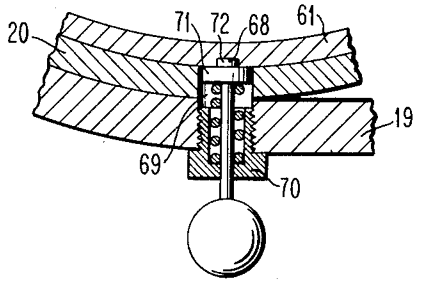
FIG. 6 is a fragmentary sectional view taken along line 6—6 of FIG. 2.

In operation the column 61 is connected to a suitable source of fluid pressure (not shown) to effect fluid pressure against the piston 22 effecting elevation of the post 20 to elevate the head and permit rotation of the head by the strut 19 for placement or removal of semiconductor wafers. The elevating post and column construction may be of any design which will permit at least elevation of the head 11 for access to the mask and hoop, such a structure as illustrated best in FIGS. 2 and 6 being more completely set forth in the U.S. Pat. to Day, No. 3,032,937 issued on May 8, 1962.

In the lapping operation it is desirable to provide a slurry, for example of the type defined in the Regh U.S. Pat. No. 3,436,259 heretofore referred to. Placing the slurry on the polishing cloth or abrasive surface 18 may be accomplished in any well-known manner as by a feed system schematically shown at 80 in FIG. 1. In order to provide a supply of slurry to the opposite side of the wafer or to the abrasive surface 42 on the second lapping means 41, the shaft 48 is provided with an axial passageway 81 which is connected to a suitable supply of slurry as through the tubing and the like 82. The conduit or passageway 81 leads into the conduit 44 interiorally of the plate 41 providing slurry or polishing solution onto the upper surface of the wafers 21, as well as the abrasive surface 42 mounted on the plate 41. As the plate 41 turns within the hoop 28, the radially extending grooves 43 in the plate catch excess slurry and due to the centrifugal force caused by rotation of the plate move the slurry outwardly through the slots 29A in the flat 29 of the hoop 28. In this manner excess polishing solution may be removed from the table or platen and caught as in a suitable container for reprocessing and reuse if such is desired.

From the foregoing it is evident that the opposite surfaces of the wafer may be simultaneously polished and/or have a greater amount of material removed form the wafer on one side then the other. For example, the platen 14 may be rotated at a speed of, for example, 60 RPM, the second lapping plate 41 rotated in the same direction at 90 RPM and the hoop rotated at, for example, 60 RPM. To remove an increased quantity from the rear or top of the wafer as by the second abrasive or polishing cloth 42, the direction of rotation of the plate 41 may be reversed while the hoop may be driven in the same direction as the platen. Additionally, if a very small surface removal is required on the reverse side of the wafer, the plate 41 may have no rotation or a very small rotation with respect to the hoop rotation and the platen rotational speed may be increased.

Additionally, as is well-known in the art, a heater may be provided in the platen as by heating coils and the like to increase the heat applied to the slurry and to the surface of the wafer thereby increasing the machine throughput.

Thus the apparatus of the present invention provides for variable polishing of the surfaces of a semiconductor wafer while being capable of almost infinite variations in the amount of surface removed from the wafer.

Although the invention has been described with a certain degree of particularity, it is understood that the present disclosure has been made only by way example and that numerous changes in the details of construction and the combination and arrangement of parts may be made without departing from the spirit and the scope of the invention as hereinafter claimed.

What is claimed is:

1. Apparatus for removing material from opposite sides of a workpiece; said apparatus comprising first lapping means engagable with one surface of said workpiece, and means for imparting rotational motion to said first lapping means against said one surface of said workpiece; workpiece holding means engagable with said workpiece for permitting relative motion between said workpiece and said first lapping means; and means for imparting rotational movement to said workpiece holding means independent of rotational motion of said first lapping means; second lapping means superimposed on said holder and first lapping means for registry with the opposite side of said workpiece, said second lapping means having an axis of rotation coincidental with the axis of rotation of said workpiece holding means, and means for imparting independent rotational movement to said second lapping means whereby material may be removed from opposite sides of a workpiece retained by said workpiece holding means.

2. Apparatus in accordance with claim 1 wherein said first lapping means comprises a platen mounted for rotation.

3. Apparatus in accordance with claim 1 wherein said workpiece holding means comprises a mask including means defining at least one aperture therein for engagement with said workpiece.

4. Apparatus in accordance with claim 3 including a hoop connected to said mask adjacent the periphery thereof, said second lapping means being dimensioned for insertion in said hoop superimposed of said mask.

5. Apparatus in accordance with claim 4 wherein said second lapping means comprises a head and a pressure plate mounted interiorally of said hoop, means defining a conduit through said plate for supplying a fluid medium to the surface of said mask, and means associated with said plate to permit levelling of said plate against the surface of said workpiece held in said mask.

6. Apparatus in accordance with claim 5 including radially extending slots eminating from said conduit of said plate, between said conduit and a terminal edge of said plate, whereby fluid medium passing through said conduit may progress outwardly along said radial slots as relative motion occurs between said mask and said plate.

7. Apparatus in accordance with claim 6 wherein said hoop includes a radially extending flat portion having a plurality of grooves therein to permit said fluid medium to pass outwardly from said hoop upon a supply of fluid medium being provided to said conduit of said plate.

8. Apparatus in accordance with claim 7 including means for connecting said mask at spaced locations to said hoop intermediate at least some of said grooves in said hoop.

9. A machine for removing a portion of the surface from opposite sides of a workpiece, said machine comprising: a platen having an abrasive on at least the upper surface thereof; first drive means for imparting rotation to said platen; a mask superimposed of said platen and including means defining apertures in said mask for receiving a plurality of workpieces therein; second drive means connected to said mask for imparting rotation to said mask separately from said platen; and plate means superimposed of all of said apertures in said mask for exerting pressure on workpieces held in said apertures of said mask, said plate means having an abrasive surface adapted for registry with said workpieces during abrasion of said workpieces; and third drive means for independently imparting motion to said plate means whereby material may be removed from opposite sides of said workpieces upon relative rotation occurring between said platen, mask and plate means.

10. Apparatus in accordance with claim 9 including a hoop connected to said mask adjacent the periphery thereof, said plate means being dimensioned for insertion in said hoop superimposed of said mask.

11. Apparatus in accordance with claim 10 including a head connected to said plate means, said plate means being mounted interiorally of said hoop, means defining a conduit through said plate means for supplying a fluid medium to the surface of said mask, and means associated with said plate means to permit levelling of said plate means against the surface of said workpiece held in said mask.

12. Apparatus in accordance with claim 11 including radially extending slots eminating from said conduit of said plate means, between said conduit and a terminal edge of said plate means, whereby fluid medium passing through said conduit may progress outwardly along said radial slots as relative motion occurs between said mask and said plate means.

13. Apparatus in accordance with claim 12 wherein said hoop includes a radially extending flat portion having a plurality of grooves therein to permit said fluid medium to pass outwardly from said hoop upon a supply of fluid medium being provided to said conduit of said plate means.

14. Apparatus in accordance with claim 13 including means for connecting said mask at spaced locations to said hoop intermediate at least some of said grooves in said hoop.

* * * * *